United States Patent
Oh et al.

(12) United States Patent (10) Patent No.: US 7,498,628 B2
Oh et al. (45) Date of Patent: Mar. 3, 2009

(54) CAPACITOR FOR A SEMICONDUCTOR DEVICE AND MANUFACTURING METHOD THEREOF

(75) Inventors: Pyeong Won Oh, Icheon-si (KR); Woo Jin Kim, Icheon-si (KR); Hoon Jung Oh, Icheon-si (KR); Hyo Gun Yoon, Icheon-si (KR); Hyo Seob Yoon, Icheon-si (KR); Baik Il Choi, Seoul (KR)

(73) Assignee: Hynix Semiconductor Inc., Icheon-shi (KR)

( * ) Notice: Subject to any disclaimer, the term of this patent is extended or adjusted under 35 U.S.C. 154(b) by 561 days.

(21) Appl. No.: 11/212,466

(22) Filed: Aug. 25, 2005

(65) Prior Publication Data

US 2006/0138514 A1 Jun. 29, 2006

(30) Foreign Application Priority Data

Dec. 23, 2004 (KR) .................. 10-2004-0111387

(51) Int. Cl.
H01L 21/00 (2006.01)
(52) U.S. Cl. .................. 257/306; 257/310; 257/296
(58) Field of Classification Search .................. 257/307, 257/310, 296
See application file for complete search history.

(56) References Cited

U.S. PATENT DOCUMENTS

| | | | |
|---|---|---|---|
| 5,390,072 A | 2/1995 | Anderson et al. | |
| 5,985,730 A | 11/1999 | Lim | |
| 5,989,635 A | 11/1999 | Kawahara et al. | |
| 6,008,086 A | 12/1999 | Schuegraf et al. | |
| 6,338,995 B1 | 1/2002 | Hwung et al. | |
| 6,395,650 B1 * | 5/2002 | Callegari et al. | 438/785 |
| 6,750,126 B1 * | 6/2004 | Visokay et al. | 438/585 |
| 6,936,508 B2 * | 8/2005 | Visokay et al. | 438/199 |
| 7,015,534 B2 * | 3/2006 | Colombo | 257/314 |
| 7,091,119 B2 * | 8/2006 | Colombo | 438/595 |
| 7,115,530 B2 * | 10/2006 | Quevedo-Lopez et al. | 438/778 |
| 7,148,546 B2 * | 12/2006 | Visokay et al. | 257/369 |
| 7,226,830 B2 * | 6/2007 | Colombo et al. | 438/216 |
| 7,351,632 B2 * | 4/2008 | Visokay et al. | 438/216 |
| 7,407,850 B2 * | 8/2008 | Venugopal et al. | 438/216 |
| 2005/0059198 A1 * | 3/2005 | Visokay et al. | 438/199 |
| 2005/0070062 A1 * | 3/2005 | Visokay et al. | 438/236 |
| 2005/0079696 A1 * | 4/2005 | Colombo | 438/595 |
| 2005/0106797 A1 * | 5/2005 | Colombo | 438/197 |
| 2005/0124109 A1 * | 6/2005 | Quevedo-Lopez et al. | 438/240 |
| 2006/0121744 A1 * | 6/2006 | Quevedo-Lopez et al. | 438/785 |

(Continued)

FOREIGN PATENT DOCUMENTS

JP 2006179860 A * 7/2006

(Continued)

*Primary Examiner*—Laura M Menz
(74) *Attorney, Agent, or Firm*—Townsend and Townsend and Crew LLP

(57) ABSTRACT

Disclosed is a capacitor for a semiconductor device, comprising: a lower electrode formed over a predetermined lower structure on a semiconductor substrate; an aluminum oxynitride film formed over the lower electrode and having a low leakage current characteristic; a yttrium oxynitride film formed over the aluminum oxynitride film and having a higher dielectric constant than the aluminum oxynitride film; and an upper electrode formed over the yttrium oxynitride film, and a manufacturing method thereof.

14 Claims, 8 Drawing Sheets

U.S. PATENT DOCUMENTS

| | | |
|---|---|---|
| 2006/0138514 A1* | 6/2006 | Oh et al. .................... 257/306 |
| 2006/0163676 A1* | 7/2006 | Shimizu et al. ............. 257/410 |
| 2006/0223248 A1* | 10/2006 | Venugopal et al. .......... 438/197 |

FOREIGN PATENT DOCUMENTS

| | | |
|---|---|---|
| KR | 10-2003-0056898 A | 7/2003 |
| KR | 1020030083441 A | 10/2003 |
| KR | 1020030083442 A | 10/2003 |
| KR | 10-2004-0020243 A | 3/2004 |
| KR | 1020040020241 A | 3/2004 |

* cited by examiner

CAPACITOR FOR A SEMICONDUCTOR DEVICE AND MANUFACTURING METHOD THEREOF

CROSS-REFERENCES TO RELATED APPLICATIONS

This application claims the benefit of Korean Patent Application No. 10-2004-111387 filed Dec. 23, 2004, the entire contents of which are hereby incorporated by reference for all purposes.

FIELD OF THE INVENTION

The present invention relates to a capacitor for a semiconductor device and a manufacturing method thereof, and more particularly, to a capacitor for a semiconductor device, which has a low leakage current characteristic and a high capacitance, and a manufacturing method thereof.

BACKGROUND OF THE INVENTION

Generally, a capacitor for a semiconductor device should have a capacitance higher than a predetermined level, and for the purpose of increasing the refresh time of a semiconductor device, especially, a DRAM or the like, continuous research and development have been carried out so as to have a lower leakage current characteristic.

Meanwhile, with the high integration of a semiconductor device, the surface area occupied by each region of the semiconductor device decreases gradually. As such, the surface area for forming a capacitor in the semiconductor device also decreases, which makes it uneasy to obtain sufficient capacitance and low leakage current characteristics.

Hereinafter, the problems of a capacitor for a semiconductor device and a manufacturing method thereof in the prior art will be described in more detail with reference to the accompanying drawings.

FIGS. 1a to 1g are cross sectional views of a conventional manufacturing process of a capacitor. Referring to these drawings, the prior art problems of a capacitor for a semiconductor device and a manufacturing method thereof will be described below.

Firstly, as shown in FIG. 1a, a structure of bit line electrodes 2 and the like is formed over a predetermined lower structure 1 formed on a semiconductor substrate (not shown) in which active regions are defined by a device isolation film (not shown).

Continually, as shown in FIG. 1b, an interlayer insulating film 3 made of an oxide film or the like is deposited on the entire surface of the top part of the above structure, and a nitride film 4 is deposited as a barrier layer on the interlayer insulating film 3.

Then, as shown in FIG. 1c, the nitride film 4 and the interlayer insulating film 3 are etched by a photoetching process to thus form a contact hole. The contact hole exposes the surface of the lower structure 1, especially the surface of a plug (not shown) connected to a junction of the semiconductor substrate (not shown) corresponding to a storage node located between the bitline electrodes 2.

Continually, as shown in FIG. 1d, a conductive polycrystalline silicon is deposited over the entire surface of the resultant material, so that the contact hole may be buried by the polycrystalline silicon. Then, a planarization process is performed on the resultant material until the nitride film 4 is exposed, to thus form a contact plug 5 within the contact hole.

Next, as shown in FIG. 1e, an oxide film 6 is deposited on the entire surface of the top part of the structure, and thereafter a predetermined region of the oxide film 6 is etched through a photoetching process, to thus expose the top part of the contact plug 5 and a predetermined region of the nitride film 4 in the peripheral part thereof. The region where the oxide film 6 is to be etched is directly related with the surface area of a lower electrode of a capacitor to be formed later, and is set as wide as possible, considering the clearance distance from the capacitor of an adjacent cell.

Continually, a polysilicon film is deposited over the entire surface of the resultant material, and thereafter the portion deposited on the oxide film 6 is removed from the deposited polysilicon film by chemical mechanical planarization (CMP) or the like. Then, the remaining oxide 6 portion is selectively etched and removed, to thus form a capacitor lower electrode 7 as shown in FIG. 1f.

Next, as shown in FIG. 1g, a dielectric film 8 is deposited on the top part of the structure. As the dielectric film, a multilayered oxide film-nitride film-oxide film is formed (i.e., an ONO film). Then, a capacitor upper electrode 9 is formed on the resultant material, thereby completing the manufacturing of the capacitor.

However, the capacitor structure including the dielectric film 8 using a prior art single ONO film cannot satisfy both the sufficient capacitance and low leakage current characteristic.

Accordingly, a dielectric film formed of AlON (aluminum oxynitride) has been used so as to improve the leakage current characteristic. In this case, however, although the interface characteristics are excellent and thus the leakage current characteristics are good, recent needs for capacitors demanding a high capacitance cannot be met due to a low capacitance characteristic.

In this way, as the integration degree of semiconductor devices is increased, capacitors utilizing a single dielectric film cannot satisfy both the capacitance and leakage current characteristics that the capacitors should have.

BRIEF SUMMARY OF THE INVENTION

It is an object of the present invention to provide a capacitor for a semiconductor device, which has a low leakage current characteristic and a high capacitance even on a small mounting surface area, and a manufacturing method thereof.

To achieve the above object of the present invention, there is provided a capacitor for a semiconductor device, comprising a lower electrode formed over a predetermined lower structure on a semiconductor substrate; a first dielectric film formed over the lower electrode and having a low leakage current characteristic; a second dielectric film formed over the first dielectric film and having a relatively higher dielectric constant than the first dielectric film; and an upper electrode formed over the second dielectric film.

The first dielectric film is an AlON (aluminum oxynitride) film, preferably, the thickness of which is 50 to 150 Å.

The second dielectric film is a YON (yttrium oxynitride) film, preferably, the thickness of which is less than 10 Å.

Preferably, the lower electrode has a dual structure of a doped silicon film and an undoped silicon film and a TiN layer, as a barrier layer, is included between the second dielectric film and the upper electrode.

Additionally, there is provided a manufacturing method of a capacitor for a semiconductor device, comprising the steps of forming a lower electrode over a predetermined lower structure on a semiconductor substrate; forming a first dielectric film having a low leakage current characteristic over the lower electrode; forming a second dielectric film having a higher dielectric constant than the first dielectric film over the first dielectric film; and forming an upper electrode over the second dielectric film.

The first dielectric film is an AlON (aluminum oxynitride) film, preferably, the thickness of which is 50 to 150 Å.

The AlON film can be deposited by PECVD (plasma-enhanced CVD) method, wherein $(CH_3)_3AL$ is used as a source material, and $H_2O$ and $NH_3$ are used as reaction material during deposition of $Al_2O_3$.

Preferably, the temperature of a wafer is 200 to 450° C. and the pressure of a reaction furnace during deposition is 0.1 to 1.0 torr, and the use amount of $H_2O$ is 10 to 500 sccm and the use amount of $NH_3$ is 10 to 500 sccm.

Preferably, the manufacturing method of the present invention further comprises the step of carrying out $N_2O$ plasma annealing after the formation of the AlON film in order to increase the $N_2$ content of the AlON film.

The second dielectric film is a YON film, preferably, the thickness of which is less than 10 Å. The YON film can be formed by ALD (atomic layer deposition) method.

Preferably, in the deposition using the ALD, yttrium gas as a source gas is injected into a reactor alternately with $NH_3$ gas and $H_2O$ gas as a reaction material and inactive gas is provided between the injection of yttrium gas and $NH_3/H_2O$ gas.

Preferably, the injection time of yttrium gas, the injection time of $NH_3/H_2O$ gas and the injection time of inactive gas are 0.1 to 10 seconds, respectively, the amount of $NH_3$ is 10 to 100 sccm, the amount of $H_2O$ is 10 to 100 sccm, and the temperature of the reactor is maintained at 250 to 350° C.

Preferably, the YON film can be formed by ICE (ionized cluster beam) deposition.

Preferably, the method of the present invention further comprise the step of carrying out $N_2O$ plasma annealing after the formation of the YON film in order to increase the $N_2$ content of the YON film.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described in more detail by referring to embodiments of the invention. The embodiments given are only for illustrating the present invention, and not for giving any limitation to the scope of the present invention.

FIGS. 2a to 2h are cross sectional views for explaining a manufacturing process of a capacitor for a semiconductor according to one embodiment of the present invention. Referring to this, the present invention will be described below.

Figure 1A:
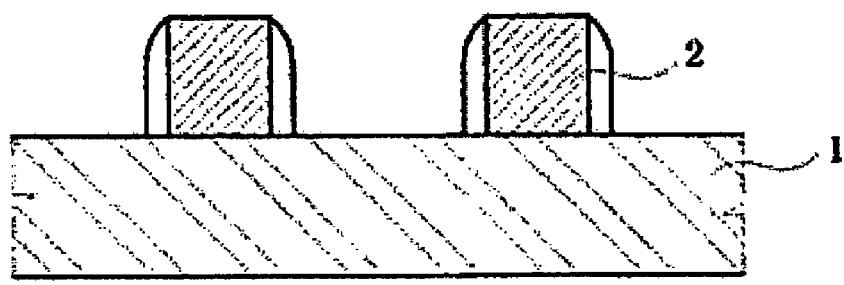
FIGS. 1a to 1g are cross sectional views of a conventional manufacturing process of a capacitor.
Figure 1B:
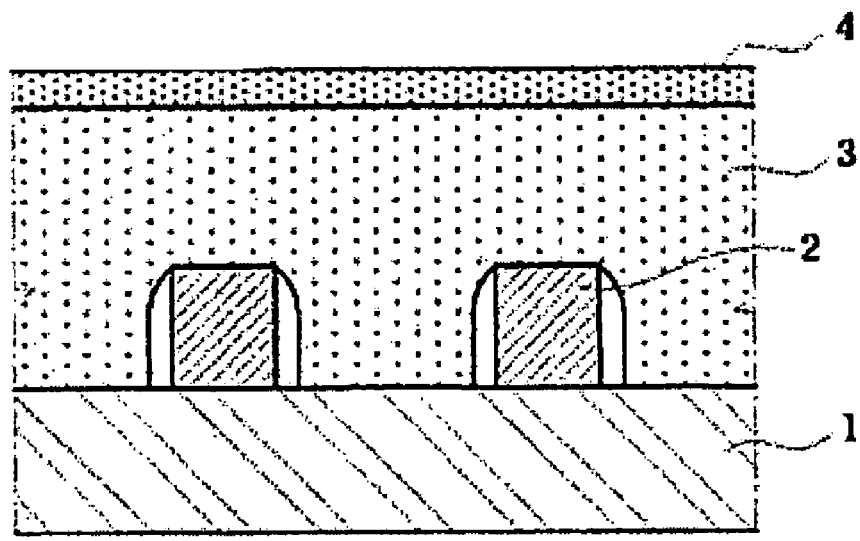
Figure 1C:
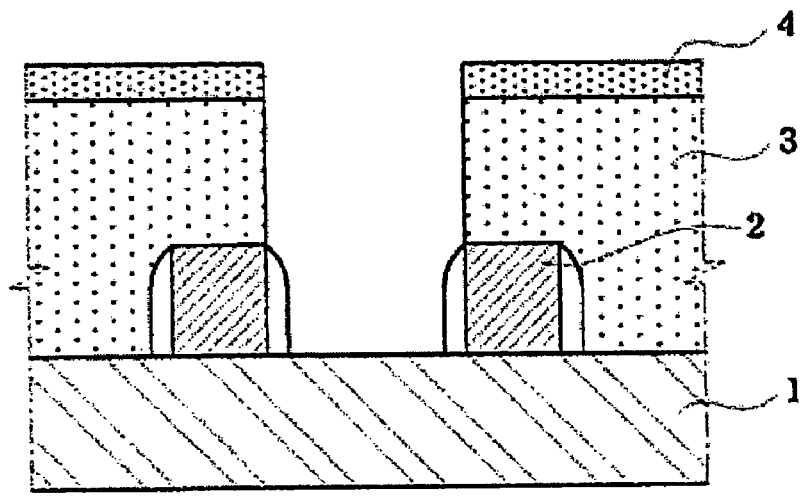
Figure 1D:
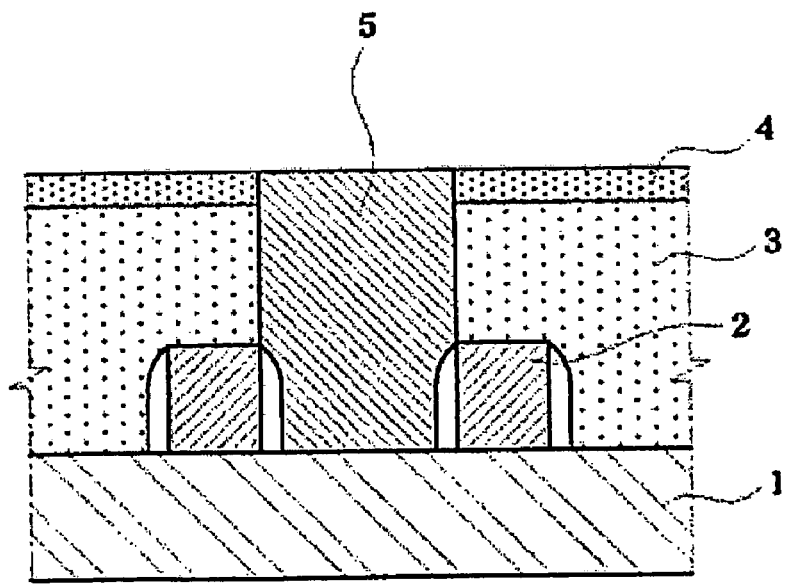
Figure 1E:
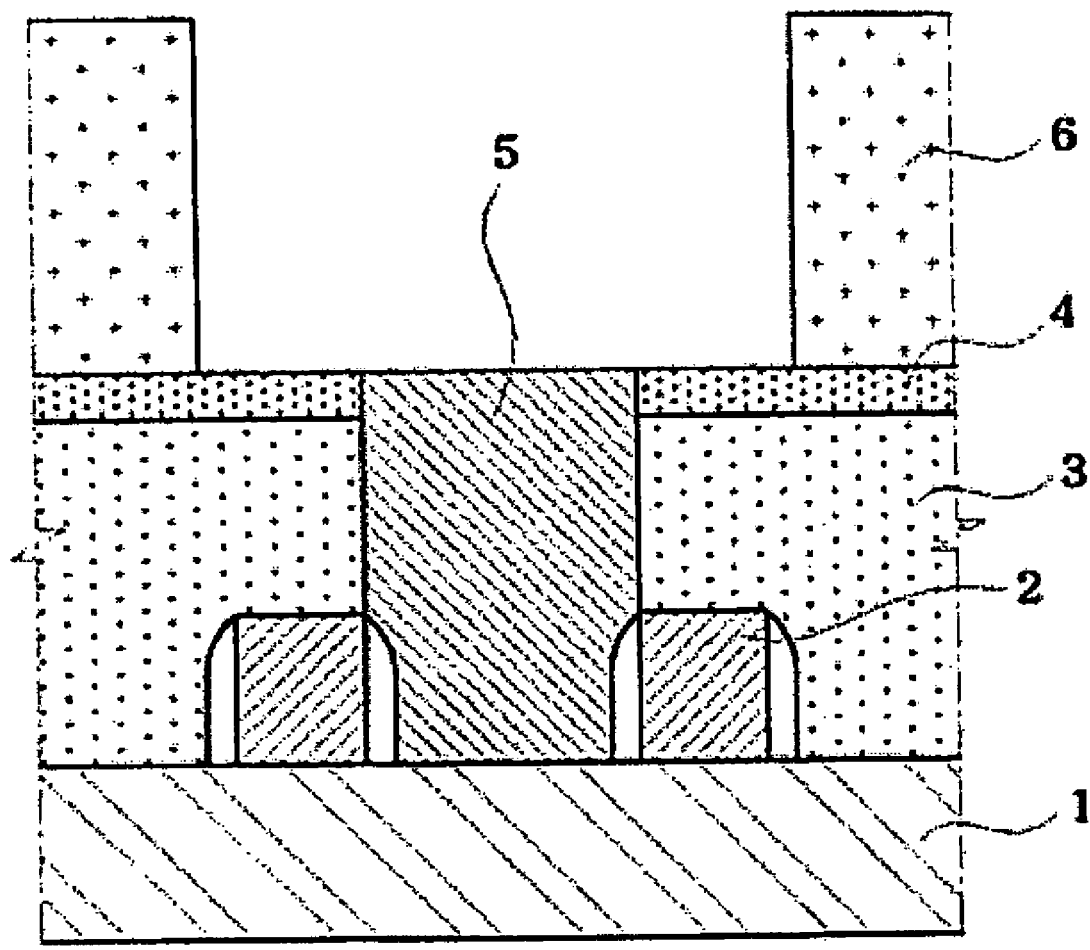
Figure 1F:
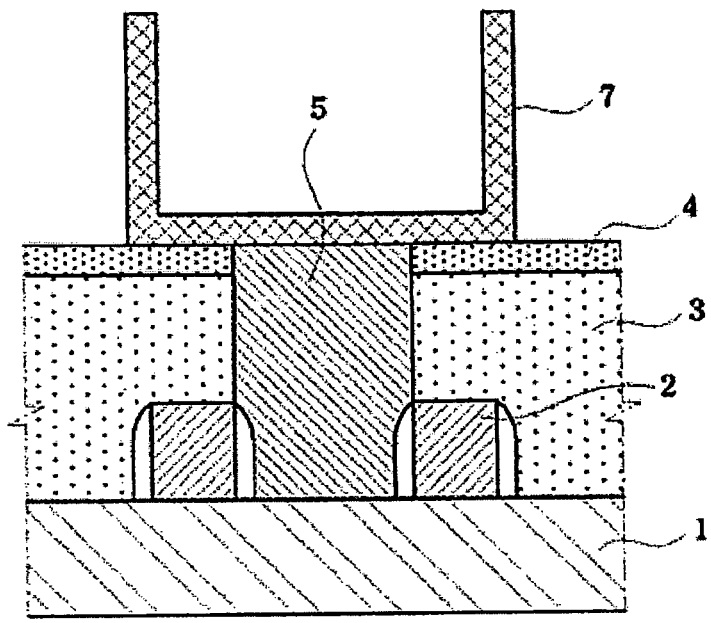
Figure 1G:
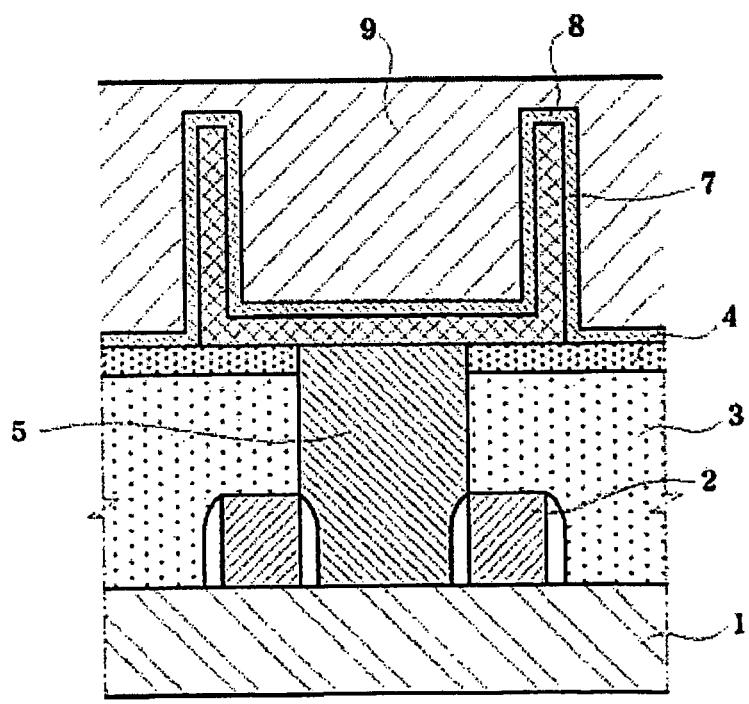
Figure 2A:
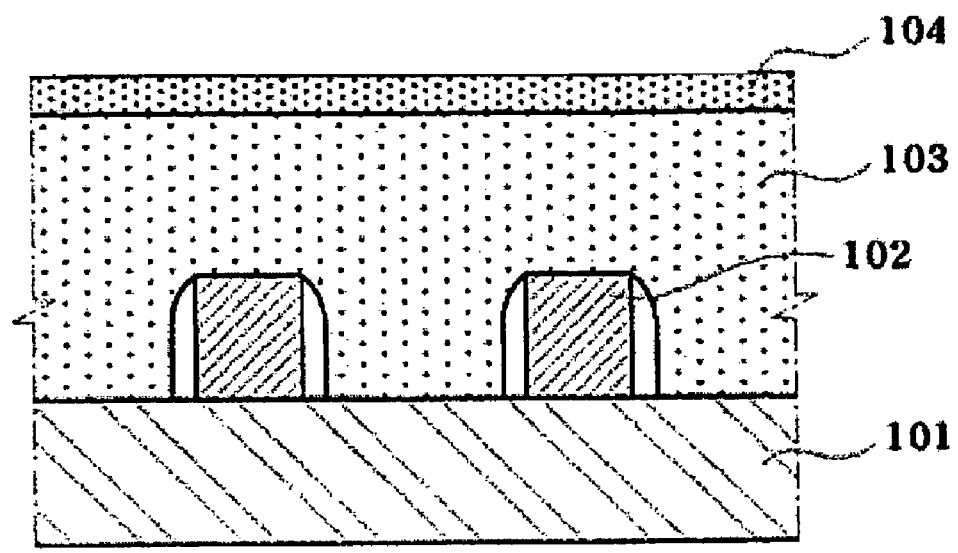
FIGS. 2a to 2h are cross sectional views for explaining a manufacturing process of a capacitor for a semiconductor according to one embodiment of the present invention.

Firstly, as shown in FIG. 2a, a structure of bit line electrodes 102 and the like is formed over a predetermined lower structure 101 formed on a semiconductor substrate (not shown) in which active regions are formed by a device isolation film (not shown). Continually, an interlayer insulating film 103 made of an oxide film or the like is deposited on the entire surface of the resultant material, and a nitride film 104 is deposited as a barrier layer on the interlayer insulating film 103.

Figure 2B:
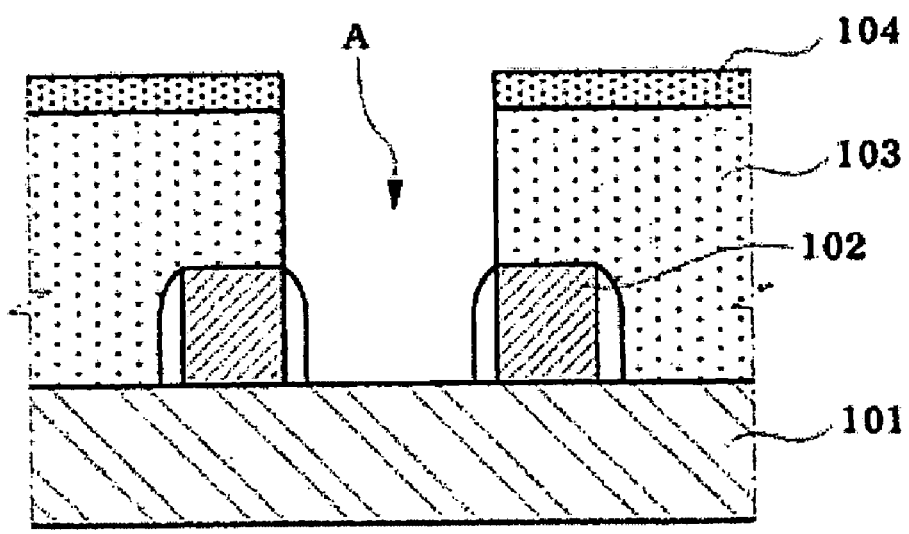

Then, as shown in FIG. 2b, the nitride film 104 and the interlayer insulating film 103 are etched by a photoetching process to thus form a contact hole. The contact hole A exposes the surface of the lower structure 101, especially the surface of a plug (not shown) connected to a junction of the semiconductor substrate (not shown) corresponding to a storage node located between the bitline electrodes 102.

Figure 2C:
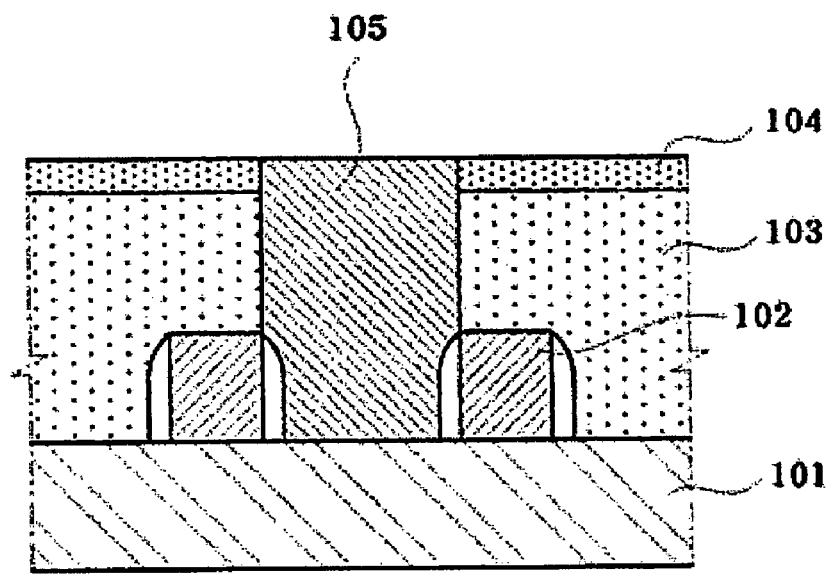

Continually, as shown in FIG. 2c, a conductive polycrystalline silicon is deposited over the entire surface of the resultant material, so that the contact hole A may be buried by the polycrystalline silicon. Then, a planarization process is performed on the resultant material until the nitride film 104 is exposed, to thus form a contact plug 105 within the contact hole A.

Figure 2D:
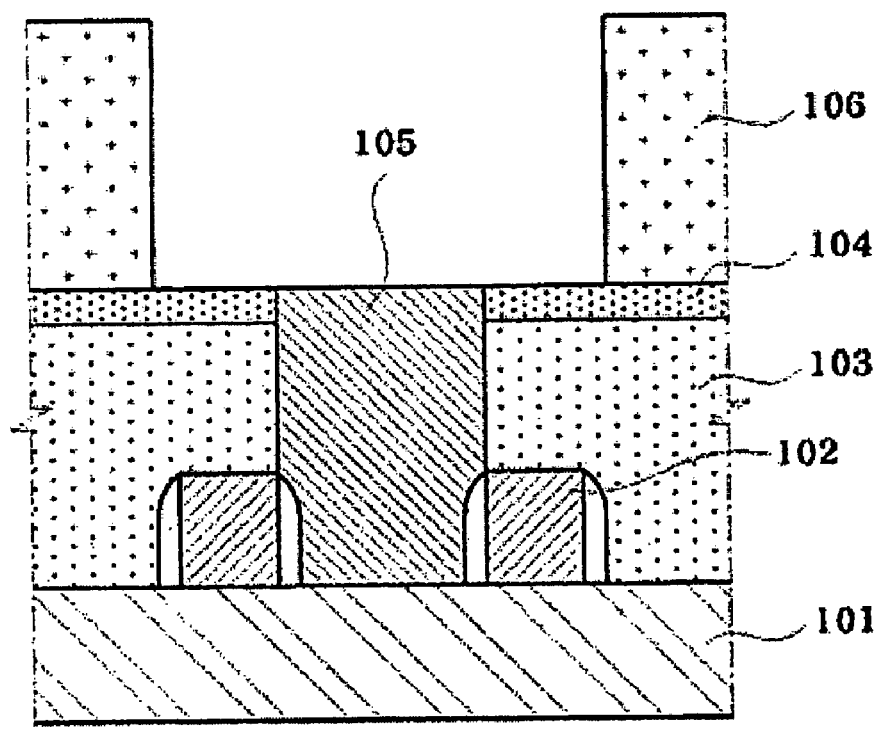

Next, as shown in FIG. 2d, an oxide film 106 is deposited on the entire surface of the top part of the structure, and thereafter a predetermined region of the oxide film 106 is etched through a photoetching process, to thus expose the top part of the contact plug 105 and a predetermined region of the nitride film 104 in the peripheral part thereof. The region where the oxide film 106 is to be etched is directly related with the surface area of a lower electrode of a capacitor to be formed later, and is set as wide as possible, considering the clearance distance from the capacitor of an adjacent cell. The oxide film 106 is deposited at a thickness of 5000 to 20000 Å.

Figure 2E:
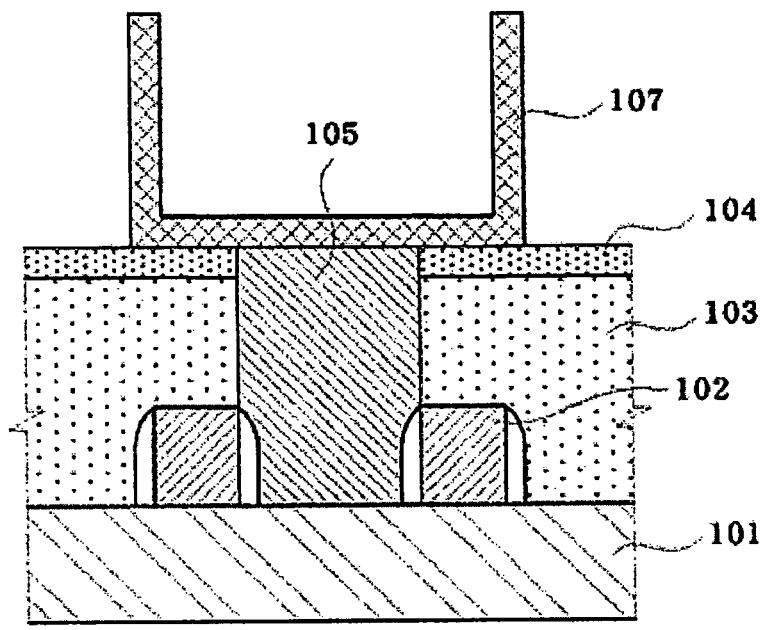

Continually, a polysilicon film is deposited over the entire surface of the resultant material, and thereafter the portion deposited on the oxide film 106 is removed from the deposited polysilicon film by chemical mechanical planarization (CMP) or the like. Then, the remaining oxide 106 portion is selectively etched and removed, to thus form a capacitor lower electrode 107 as shown in FIG. 2e. The polysilicon film used as the capacitor lower electrode 107 is formed by two deposit steps of depositing a doped silicon film at 100 to 300 Å and then deposit an undoped silicon film at 100 to 500 Å under a temperature of 500 to 560° C., especially, 530° C., and a pressure of 0.5 to 1.0 torr. When depositing the doped silicon film, 800 to 1200 sccm of $SiH_4$ and 150 to 250 sccm of $PH_3$ are used, while depositing the undoped silicon film, 800 to 1200 sccm of $SiH_4$ and 0 sccm of $PH_3$ are used.

Figure 2F:
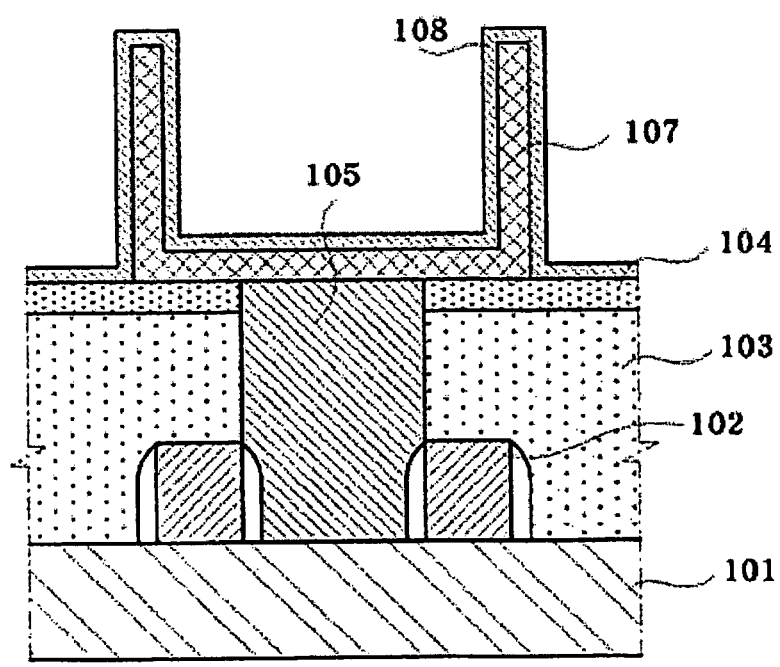

Next, as shown in FIG. 2f, an AlON (aluminum oxynitride) film 108 having a dense film material and causing a lower leakage current is deposited on the top part of the resultant material. Since the AlON film 108 exhibits excellent interface characteristics due to its dense film material, it serves to suppress the formation of an interfacial film between it and the lower electrode 107 to thus suppress leakage current. At this time, the AlON film 108 is deposited using PECVD (plasma-enhanced CVD). When depositing, using the PECVD method, the temperature of a wafer is 200 to 450° C., the pressure of a reaction furnace during deposition is 0.1 to 1.0 torr, and $(CH_3)_3AL$ is used as source material. While depositing, when $Al_2O_3$, $H_2O$ and $NH_3$ are used as the reaction material. The amount of $H_2O$ used is 10 to 500 sccm, and the amount of $NH_3$ used is 10 to 500 sccm. The thickness of the AlON film 108 to be deposited is 50 to 150 Å, and the RF power during deposition is 10 to 500 watts. This film thickness is set considering the dielectric constant and leakage current prevention characteristic of the entire dielectric film. If less than this range, the leakage current prevention characteristic is degraded, while if greater than this range, the dielectric constant is degraded, thereby failing to exhibit sufficient capacitance.

Continually, an annealing process is performed on the resultant material having the AlON film 108 formed thereto. In this annealing process, a $N_2O$ plasma annealing is carried out in order to increase the $N_2$ content of the AlON film 108. At this time, in case of rapid thermal annealing, the amount of $N_2O$ gas is 1 to 10 slm, the temperature is kept between 700 to 850° C., and the duration time is 60 to 180 seconds. As such, if the content of $N_2$ increases, the dielectric constant also increases and the film material becomes denser.

Figure 2G:
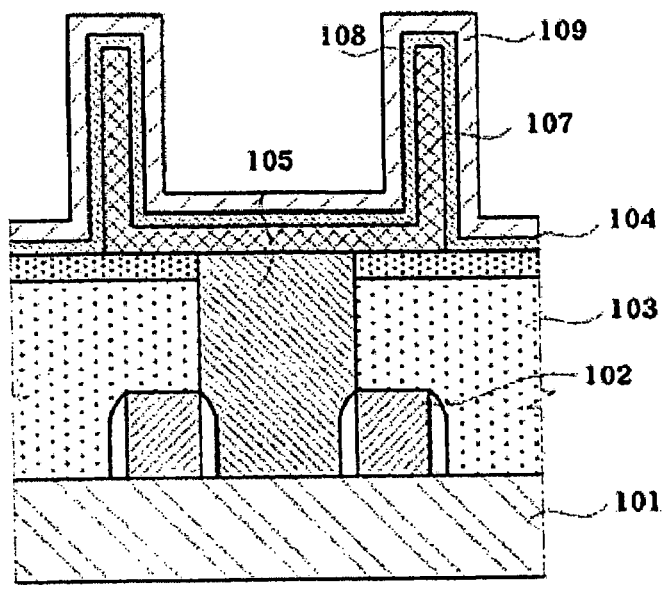

Next, as shown in FIG. 2g, a YON film (yttrium oxynitride) 109 having a high dielectric constant is deposited on the top part of the AlON film 108. Since the YON film 109 has a dielectric constant of approximately 25 and thus has a high capacitance, it allows the manufacture of a high-capacity capacitor. At this point, the YON film 109 is formed by ALD (atomic layer deposition), that is, the YON film is deposited within a thickness of 10 Å by injecting yttrium gas, a source gas, into a reactor alternately with $NH_3$ gas and $H_2O$ gas, reaction material. An inert gas, such as $N_2$, Ar, He, etc., is provided between the injection of yttrium gas and $NH_3/H_2O$ gas so that no residuals of each material are left.

In the deposition using the ALD, a thin film less than 1 Å is deposited per cycle, one cycle consisting of a source gas injection, inactive gas injection, and $NH_3/H_2O$ gas injection, and a YON film 109 is formed at a total thickness of 10 Å by repeating the above cycle. The injection time of each reaction material and the injection time of inactive gas are 0.1 to 10 seconds, respectively. And, the amount of $NH_3$ as a reaction gas is 10 to 100 sccm, the amount of $H_2O$ is 10 to 100 sccm, and the temperature of the reactor is kept from 250 to 350° C. The thin film continuously deposited by repeating the above cycle is annealed at a low temperature under the temperature of 400 to 550° C. so as to be transformed into a single film.

In the formation of the YON film 109, ICE (ionized cluster beam) deposition may be employed.

As seen above, in the present invention, leakage currents of a capacitor can be decreased and capacitance can be greatly increased by forming a dielectric film of a dual layer structure by first forming an AlON film 108 on a lower electrode of the capacitor and then forming a YON film 109 thereon. In other words, since the AlON film 108 first formed on the lower electrode exhibits excellent interface characteristics due to its dense film material, it suppresses the formation of an interfacial film between it and the lower electrode 107 to thus suppress leakage current. Besides, since the YON film 109 formed on the AlON film 108 has an extremely high dielectric constant of approximately 25, it can greatly increase the capacitance of the capacitor. Therefore, the manufacturing method for a capacitor according to the present invention can sharply decrease the leakage current of the capacitor and greatly increase the capacitance thereof by using a dielectric film with a dual structure of an AlON film 108 and a YON film 109.

Furthermore, in the case that the YON film is used as a single dielectric film by being deposited on the lower electrode, this may cause an interfacial reaction between the polysilicon of the lower electrode and the YON film to produce $SiO_2$ having a low dielectric constant, thereby degrading the YON film in terms of quality. In the present invention, an AlON film 108, whose film material is dense, is formed before forming a YON film 109, thereby suppressing the formation of an interface film between the YON film and the lower electrode and thus suppressing the quality degradation of the YON film 109.

Continually, a $N_2O$ plasma annealing is carried out on the resultant material in order to increase the $N_2$ content of the YON film 109. At this time, in case of rapid thermal annealing, the amount of $N_2O$ gas is 1 to 10 slm, the temperature is kept between 700 to 850° C., and the duration time is 60 to 180 seconds. As such, if the content of $N_2$ increases, the dielectric constant also increases and the film material becomes denser.

Next, in order to remove impurities in the AlON film 108 and YON film 109 and maintain the increased $N_2$ content, furnace vacuum $N_2$ annealing is performed. In the furnace vacuum $N_2$ annealing, the temperature is kept between 500 to 650° C., and the duration time is 5 to 60 minutes. Alternatively, a rapid thermal processing (RTP) may be performed instead of the furnace vacuum $N_2$ annealing.

Figure 2H:
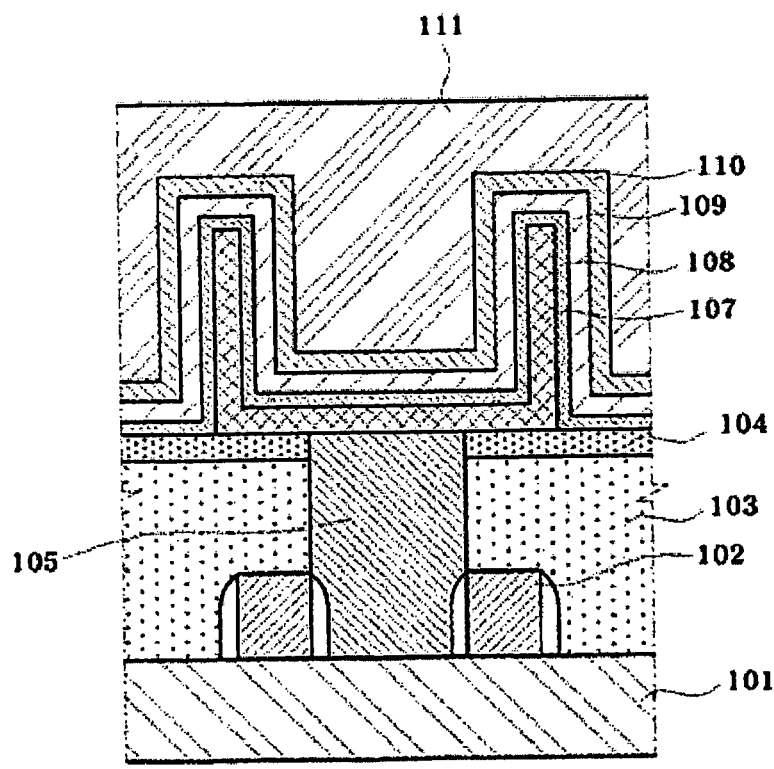

Continually, as shown in FIG. 2h, a TiN layer is deposited as a barrier layer 110 on the entire surface of the above structure, and polysilicon is deposited on the top thereof, thereby manufacturing a capacitor upper electrode 111.

The capacitor formed as above may be used as a cell capacitor of a DRAM, as well as a capacitor device in various fields of semiconductor devices.

As described above, according to the present invention, it is possible to obtain a capacitor having a high capacitance and a low leakage current characteristics, even if the surface area of the capacitor is decreased as the integration degree of the semiconductor device is increased, by using a bi-layered film of an AlON film characteristic of low leakage current and a YON film characteristic of high capacitance as a dielectric film of the capacitor.

Moreover, the present invention allows for the manufacture of a capacitor having a higher capacitance and lower leakage current characteristics by improving the film material of the dielectric film or the like and increasing the capacitance through an additional process of increasing the content of nitrogen in an AlON film having a low leakage current characteristic and a YON film having a high capacitance characteristic, respectively.

What is claimed is:

1. A manufacturing method of a capacitor for a semiconductor device, comprising the steps of:
   forming a lower electrode over a predetermined lower structure on a semiconductor substrate;
   forming an aluminum oxynitride film having a low leakage current characteristic over the lower electrode;
   forming a yttrium oxynitride film having a relatively higher dielectric constant than the aluminum oxynitride film over the aluminum oxynitride film; and
   forming an upper electrode over the yttrium oxynitride film.

2. The method of claim 1, wherein the thickness of the aluminum oxynitride film is 50 to 15 Å.

3. The method of claim 1, wherein the aluminum oxynitride film is deposited by using plasma-enhanced chemical vapor deposition.

4. The method of claim 3, $(CH_3)_3Al$ is used as source material, and $H_2O$ and $NH_3$ are used as reaction material while $Al_2O_3$ is deposited.

5. The method of claim 4, wherein the temperature of a wafer is 200 to 450 ÿ and the pressure of a reaction furnace during deposition is 0.1 to 1.0 torr, and the amount of $H_2O$ used is 10 to 500 sccm and the amount of $NH_3$ used is 10 to 500 sccm.

6. The method of claim 1, further comprising the step of carrying out $N_2O$ plasma annealing after forming the aluminum oxynitride film in order to increase the $N_2$ content of the aluminum oxynitride film.

7. The method of claim 1, wherein the thickness of the yttrium oxynitride film is less than 10 Å.

8. The method of claim 1, wherein the yttrium oxynitride film is formed using atomic layer deposition.

9. The method of claim 8, wherein yttrium gas as a source gas is injected into a reactor alternately with $NH_3$ gas and $H_2O$ gas as reaction material and an inactive gas is provided between the injection of yttrium gas and $NH_3/H_2O$ gas.

10. The method of claim 9, wherein the injection time of yttrium gas, the injection time of $NH_3/H_2O$ gas and the injection time of inactive gas are 0.1 to 10 seconds, respectively, the amount of $NH_3$ is 10 to 100 sccm, the amount of $H_2O$ is 10 to 100 sccm, and the temperature of the reactor is kept between 250 to 350 ÿ.

11. The method of claim 1, wherein the yttrium oxynitride film is formed using ionized cluster beam deposition.

12. The method of claim 1, further comprising the step of carrying out $N_2O$ plasma annealing after forming the yttrium oxynitride film in order to increase the $N_2$ content of the yttrium oxynitride film.

13. The method of claim 12, further comprising the step of carrying out furnace vacuum $N_2$ annealing or rapid thermal processing (RTP) after the $N_2O$ plasma annealing.

14. The method of claim 1, further comprising the step of depositing a titanium nitride layer as a barrier layer after forming the yttrium oxynitride film.

\* \* \* \* \*